United States Patent [19]
Farrow et al.

[11] Patent Number: 6,088,204
[45] Date of Patent: Jul. 11, 2000

[54] MAGNETORESISTIVE MAGNETIC RECORDING HEAD WITH PERMALLOY SENSOR LAYER DEPOSITED WITH SUBSTRATE HEATING

[75] Inventors: Robin Frederick Charles Farrow; Ronald Franklin Marks; Daniele Mauri; Stuart Stephen Papworth Parkin, all of San Jose, Calif.

[73] Assignee: International Business Machines Corporation, Armonk, N.Y.

[21] Appl. No.: 08/348,551

[22] Filed: Dec. 1, 1994

[51] Int. Cl.[7] ........................................ G11B 5/39
[52] U.S. Cl. ............................................. 360/327
[58] Field of Search ........................ 360/113, 125, 360/126, 327; 338/32 R, 225 D, 325

[56] References Cited

U.S. PATENT DOCUMENTS

| | | | |
|---|---|---|---|
| 4,824,731 | 4/1989 | Matsuyama et al. | 360/126 |
| 4,841,402 | 6/1989 | Imaraka et al. | 360/126 |
| 4,939,610 | 7/1990 | Narishige et al. | 360/126 |
| 5,032,943 | 7/1991 | Katsumata et al. | 360/113 |
| 5,165,087 | 11/1992 | Schwee | 365/87 |
| 5,181,149 | 1/1993 | Katsumata et al. | 360/119 |
| 5,243,316 | 9/1993 | Sakakima et al. | 338/32 R |
| 5,401,542 | 3/1995 | Kitada et al. | 427/566 |

FOREIGN PATENT DOCUMENTS

| | | |
|---|---|---|
| 61-104486 | 5/1986 | Japan . |
| 1-96815 | 4/1989 | Japan . |

OTHER PUBLICATIONS

F. Jeffers et al., "Soft–adjacent–layer Self–biased Magnetoresistive Heads in High–density Recording", IEEE Transactions on Magnetics, vol. MAG–21, No. 5, Sep. 1985, pp. 1563–1565.

Krongelb, "Improvement of the Magnetoresistive Effect in Permalloy Films", IBM Technical Disclosure Bulletin, vol. 15, No. 11, Apr. 1973, p. 3320.

Krongelb, "The Preparation and Properties of Magnetoresistive Permalloy Films", Journal of Electronic Materials, vol. 2, No. 2, 1973, pp. 227–238.

*Primary Examiner*—Jefferson Evans
*Attorney, Agent, or Firm*—Thomas R. Berthold

[57] ABSTRACT

A magnetoresistive sensor for use as the read sensor in magnetic recording disk drives uses a permalloy (approximate composition of $Ni_{81}Fe_{19}$) sensor layer with a magnetoresistance coefficient significantly greater than prior art permalloy sensor layers for a range of permalloy film thicknesses. The permalloy film is deposited on a substrate, such as alumina, that is essentially non-reactive with permalloy at elevated temperatures while the substrate is heated. The permalloy films have a zero or slightly negative magnetostriction, low easy and hard axis coercivities, and a low anisotropy field. At very small film thicknesses the permalloy films formed with substrate heating exhibit an even greater percentage increase in magnetoresistance coefficient than at higher film thicknesses, thereby allowing the films to function in magnetic recording disk drive heads for use at very high linear recording densities. The precise composition of the Ni—Fe alloy forming the sensor layer can be varied slightly, depending on the film thickness, to provide a sensor layer with essentially zero or slightly negative magnetostriction.

11 Claims, 8 Drawing Sheets

MAGNETORESISTIVE MAGNETIC RECORDING HEAD WITH PERMALLOY SENSOR LAYER DEPOSITED WITH SUBSTRATE HEATING

TECHNICAL FIELD

This invention relates in general to magnetic recording systems that read data using magnetoresistive (MR) read heads, and in particular to an improved permalloy sensor layer for use as the MR sensor layer in the heads.

BACKGROUND OF THE INVENTION

In magnetic recording data storage systems, recording heads that use read sensors based on the magnetoresistive effect, called MR heads, have demonstrated capabilities of reading data recorded at very large areal densities on the magnetic recording medium. MR heads are becoming the technology of choice in both high and low-end magnetic recording systems, such as magnetic recording rigid disk drives. In spite of their present success their extendibility to yet higher areal recording densities is limited. An especially important limitation results directly from the basic physical effect at the heart of the magnetic field detection, i.e., the anisotropic magnetoresistance (AMR) of the material used in the read sensor. The magnetic field from the magnetic recording medium is sensed from a change in the resistance of the read sensor. In conventional MR heads the material used to form the read sensor is permalloy, $Ni_{1-x}Fe_x$ (x approximately 0.19), for which the AMR gives rise to a small percentage change in resistance. A commonly used figure of merit, which estimates the signal capability of a given MR read sensor material, is the magnetoresistance coefficient, $\Delta R/R$, computed by dividing the change in resistance (for current parallel and perpendicular to the sensor magnetization) by the average resistance. A high $\Delta R/R$ is thus desirable in magnetic recording systems that use MR heads. The magnetoresistance coefficient for bulk permalloy is only about 4.0%.

Figure 1:
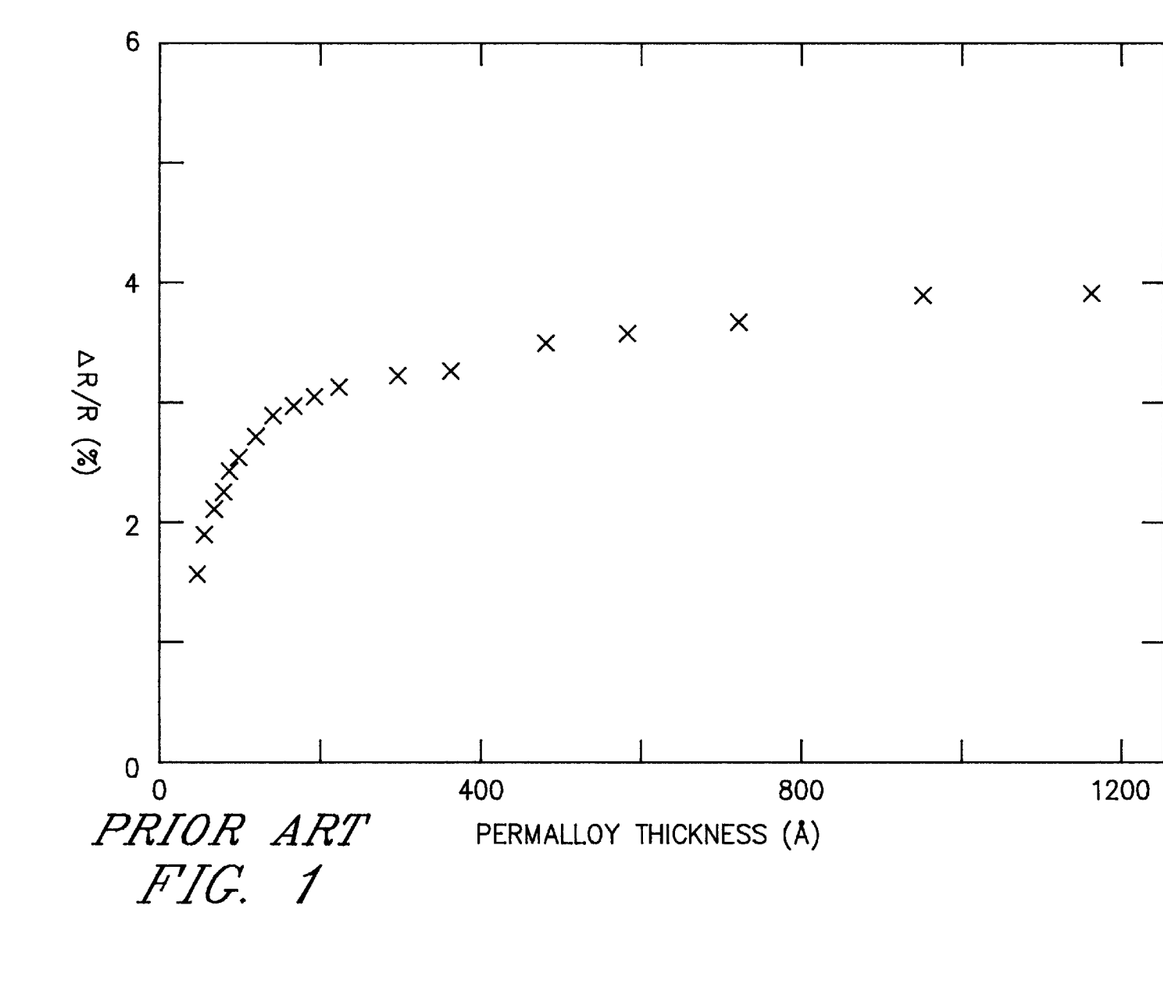
FIG. 1 is a graph showing the prior art relationship between ΔR/R and film thickness for permalloy films formed by conventional sputter deposition on substrates of 40 Å tantalum (Ta) on silicon (Si), where the substrate temperature was approximately 50° C.

In magnetic recording disk drives, the thickness of the permalloy sensor layer in the MR head is constrained by the overall magnetic design of the head and disk, and essentially tracks the magnetic thickness of the disk. As the linear bit density in the disk increases, the magnetic thickness of the disk must be scaled down to reduce the transition width between adjacent magnetic bits, and thus with it the thickness of the MR sensor layer. However, the physical mechanism underlying AMR means that as the sensor layer thickness is reduced and becomes comparable to the mean free path of the conduction electrons, the magnetoresistance coefficient is also reduced significantly. This gives rise to severe limitations on the use of MR heads. For example, the MR permalloy sensor layer thickness required for a disk with 1 Gbit/in² areal recording density is of the order of 150 Å. This corresponds to a magnetoresistance coefficient of only about 2.0%, i.e., about half of the value for bulk permalloy. An even faster decrease in the AMR effect is observed as the MR sensor layer thickness drops below 100 Å, which is the thickness range required for disk areal densities exceeding approximately 5 Gbit/in². FIG. 1 is a graph showing the prior art relationship between $\Delta R/R$ and film thickness for permalloy films formed by conventional sputter deposition on substrates of 40 Å tantalum (Ta) on silicon (Si), where the substrate temperature was approximately 50° C. The data in FIG. 1 is for films using a substrate structure and room temperature deposition that is known to produce the state of the art highest achievable $\Delta R/R$. This relationship between $\Delta R/R$ and permalloy film thickness can be approximated by a mathematical curve fit of data as follows:

$$\Delta R/R = A/(1+B/t) \tag{1}$$

where A and B are constants and t is the permalloy film thickness.

An additional requirement of MR heads is that the MR sensor layer material exhibit low, preferably zero, magnetostriction. Magnetostriction (in actuality "saturation magnetostriction") is the fractional change in length, $\Delta l/l$, of the MR sensor layer material when the sample is magnetized to saturation from its unmagnetized state, where "l" is the length of the material sample in the direction of the applied magnetic field and "$\Delta l$" is the change in length of the sample. The magnetostriction must be close to zero in the MR head sensor layer because of uncontrollable stresses induced in the head during fabrication and lapping of the wafer on which the head is formed. These stresses result in strain in the material and consequently, through an inverse magnetostriction effect, alter the magnetic properties of the material. In particular, magnetic anisotropies can thereby be induced in the material. If the magnetostriction is negative this means that the magnetization preferentially aligns itself along the length of the MR sensor (because of the nature of the induced stress). A slightly negative magnetostriction is preferred. The problem is that the nature and magnitude of the stresses induced in the MR sensor layer are not predictable and therefore result in unpredictable magnetic properties. Since the MR sensor layer is magnetically soft, so that it is sensitive to small magnetic fields, any induced magnetic anisotropies can seriously degrade the performance of the MR head.

The MR sensor layer must also have a low value of anisotropy field (generally less than approximately 10 Oersteds). The anisotropy field is the field necessary to saturate the layer in the hard magnetization direction. A low anisotropy field is necessary for the sensor magnetization to rotate in response to the weak magnetic fields generated by the magnetic transitions recorded on the disk.

Permalloy films have been formed in the past by either thermal annealing the film after deposition or by heating the substrate during film deposition. These techniques and the results are described in *IBM Technical Disclosure Bulletin*, Vol. 15, No. 11 (April 1973), p. 3320; *Journal of Electronic Materials*, Vol. 2, No. 2 (1973), pp. 227–238 and *IEEE Transactions on Magnetics*, Vol. MAG-21, No. 5, September 1985, pp. 1563–1565. However, these techniques have not resulted in an increased $\Delta R/R$ over the highest value achievable by deposition at room temperature and have also been accompanied by an unacceptable increase in magnetostriction and coercivities. It is generally understood that low easy axis and hard axis coercivities, and a low anisotropy field less than approximately 10 Oersteds (Oe) are desirable in MR permalloy sensor layers. A significant hard axis coercivity indicates a dispersion in the anisotropy field which may lead to noisy sensor response.

Thus what is needed is an MR head with a permalloy sensor layer that has an enhanced magnetoresistance coefficient to offset the signal loss that results from the necessary reductions in the thickness of the layer, so that an MR head can be fabricated that will function with extremely high areal densities on the disk. The MR sensor layer must exhibit this enhanced magnetoresistance coefficient at very low thicknesses to have the largest impact on current and future magnetic recording technology. The MR sensor layer must also have low coercivities and anisotropy field and essentially zero or slightly negative magnetostriction.

SUMMARY OF THE INVENTION

The invention is a magnetoresistive sensor having a permalloy sensor layer with a magnetoresistance coefficient significantly greater than prior art permalloy sensor layers for a range of permalloy film thicknesses. The permalloy film is deposited on a substrate that is essentially non-reactive with permalloy at elevated temperatures while the substrate is heated. The permalloy films have a slightly negative magnetostriction, low easy and hard axis coercivities, and a low anisotropy field. At very small film thicknesses the permalloy films formed with substrate heating exhibit an even greater percentage increase in magnetoresistance coefficient than at higher film thicknesses, thereby allowing the films to function in magnetic recording disk drive heads for use at very high linear recording densities. The precise composition of the Ni—Fe alloy forming the sensor layer can be varied slightly, depending on the film thickness, to provide a sensor layer with essentially zero or slightly negative magnetostriction.

For a fuller understanding of the nature and advantages of the present invention, reference should be made to the following detailed description taken in conjunction with the accompanying figures.

DETAILED DESCRIPTION OF THE INVENTION

Prior Art

Before describing the MR head of the present invention and the process for making it, a conventional magnetic recording disk drive into which the MR head is incorporated will be briefly described. Although the present invention will be described as being incorporated into a magnetic recording disk drive as shown, the invention is also applicable to other magnetic recording systems, such as a magnetic tape recording system, and to other systems that use MR elements or sensors, such as magnetic field sensors and magnetic random access memory systems.

Figure 2:
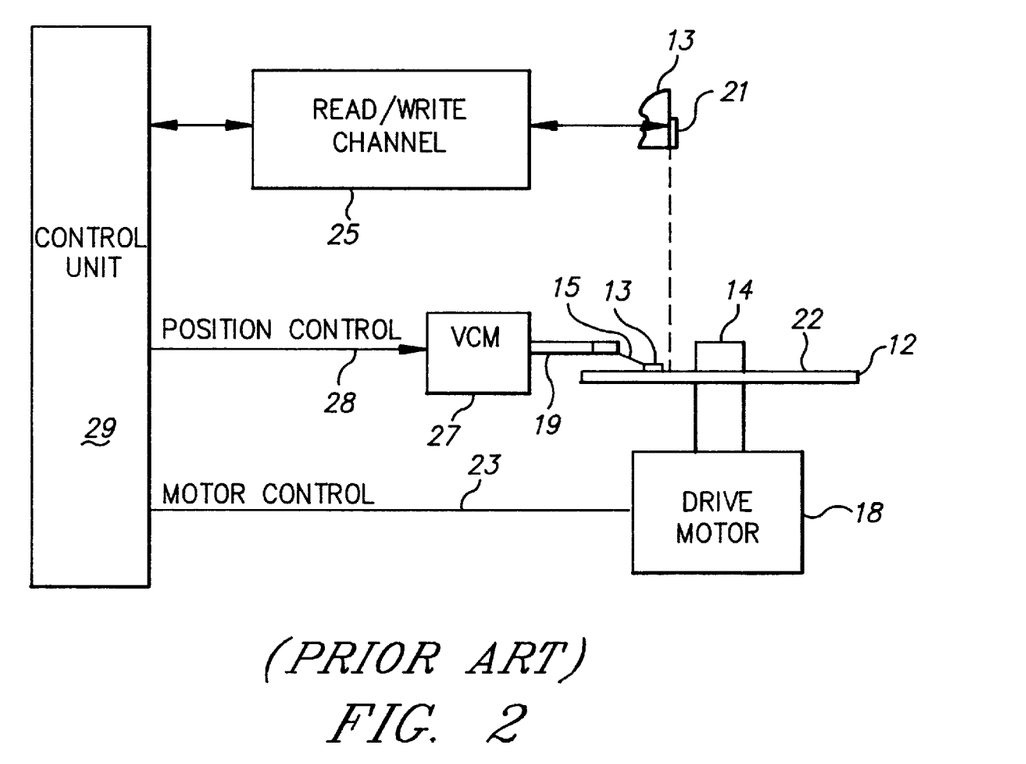
FIG. 2 is a block diagram of a conventional magnetic recording disk drive.

Referring now to FIG. 2, a rotatable magnetic disk 12 is supported on a spindle 14 and rotated by a disk drive motor 18. The magnetic recording media on the disk 12 is in the form of an annular pattern of concentric data tracks (not shown).

A head carrier 13 is positioned on the disk 12, the carrier 13 supporting one or more magnetic transducers 21 for reading and/or writing data. The transducers are typically referred to as read/write heads that include an inductive write element or head for writing data and a magnetoresistive read head or element for reading recorded data. As the disk rotates, the carrier 13 is moved radially in and out over the disk surface 22 so that the head 21 may access different portions of the disk where desired data is recorded. The carrier 13 is attached to an actuator arm 19 by means of a suspension 15. The suspension 15 provides a slight spring force which biases the carrier 13 towards the disk surface 22. The actuator arm 19 is attached to an actuator 27 such as a voice coil motor (VCM) that comprises a coil movable within a fixed magnetic field. The rotation of disk 12 generates an air bearing between the carrier 13 and the disk surface 22 that exerts an upward force or lift on the carrier 13. The air bearing thus counterbalances the slight spring force of the suspension 15 and supports the carrier 13 off and slightly above the disk surface by a small, substantially constant spacing during operation.

The various components of the disk drive are controlled by control signals from control unit 29, such as drive motor control signals on line 23 and VCM control signals on line 28. The control signals on line 28 provide the desired current profiles to VCM 27 to optimally position the carrier 13 to the desired data track on disk 12. Read and write signals are communicated to and from the read/write head 21 by means of the read/write channel 25. A current source (not shown) is used to apply a bias current to the MR sensor layer in the MR read head. The read/write channel 25 also includes MR signal amplification and detection circuitry.

The above description of a magnetic recording disk drive, and the accompanying block diagram of FIG. 2, explains the operation of a disk drive with a single read/write head and a single disk. However, disk drives typically contain a number of disks with the actuator supporting a number of head carriers.

Figure 3:
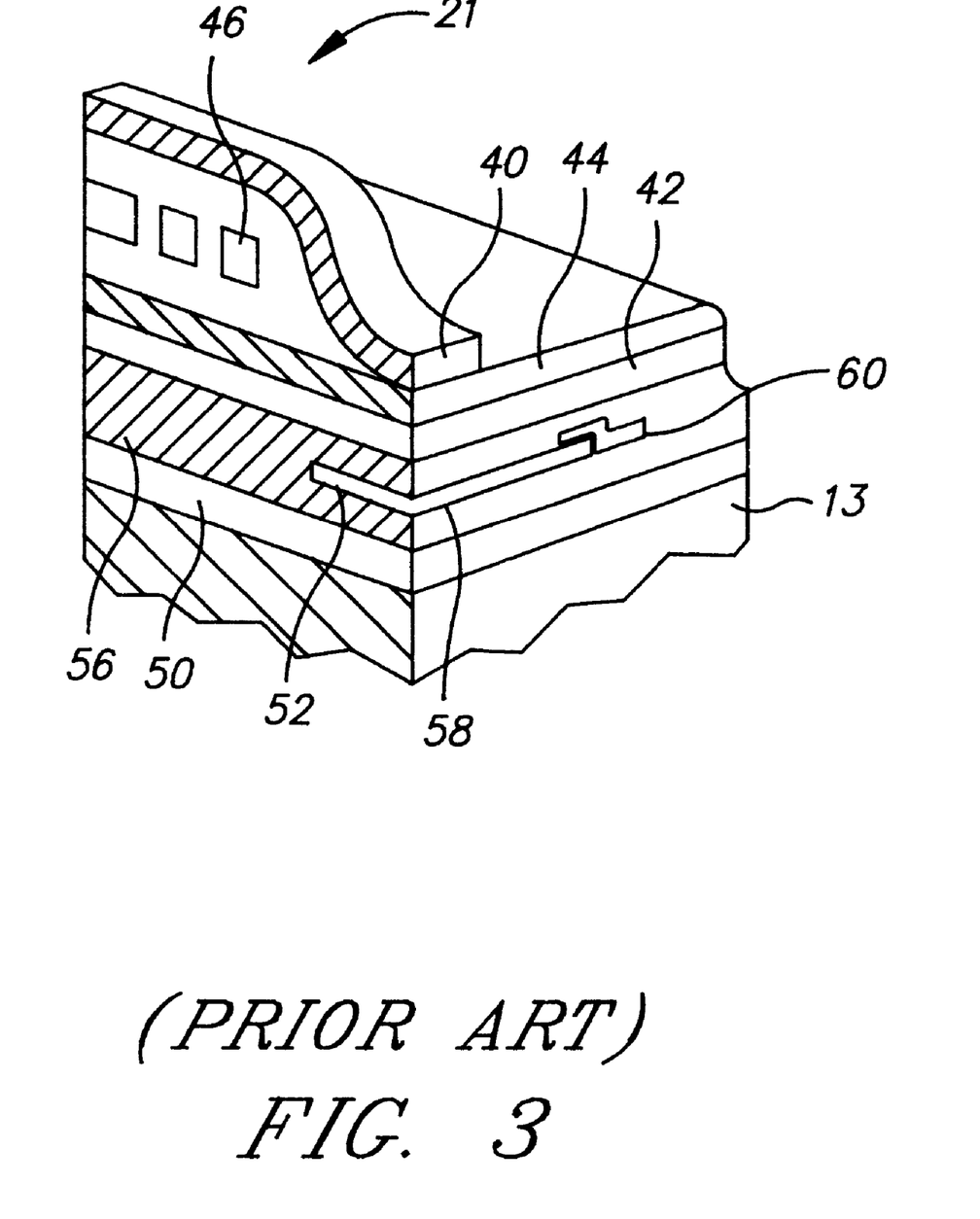
FIG. 3 is a sectional view of a conventional inductive write head and magnetoresistive read head usable with the disk drive of FIG. 2.

Referring now to FIG. 3, the read/write head 21 formed on carrier 13 is shown in sectional view to illustrate the films making up the structure. The basic head design consists of separate read and write structures formed over each other and sharing some common elements. The write structure is a thin film inductive head comprising pole pieces 40, 42 which define a write gap 44. The copper coils 46 making up the inductive write head are shown in sectional view between the pole pieces 40, 42. A first MR shield 50 is deposited on an oxide film grown on the substrate surface of carrier 13. The inductive pole piece 42 also serves as a second MR shield. MR shields 42, 50 are spaced apart from the MR sensor layer 52, which is located in the middle of gap material 56 between the two MR shields 42, 50. The MR sensor layer 52 is a permalloy layer that has a sensing end 58 which is aligned generally parallel with the surface of the magnetic recording disk 12. As shown in FIG. 3, one end of MR sensor layer 52 has a lead 60 attached to it. Since FIG. 3 is a sectional view showing the interior of the read/write head 21, the opposite half of sensor layer 52 and its associated electrical lead is not shown. The electrical leads are connected to the current source to supply a bias current through sensor layer 52 and to detect changes in resistance corresponding to changes in magnetic flux from the magnetic recording disk.

Not shown in FIG. 3 are the well-known additional films used to fabricate the MR head. A tantalum (Ta) underlayer may be located under the permalloy sensor layer 52. A soft magnetic layer, for example a layer of Ni—Fe—Cr, Ni—Fe—Rh or Ni—Fe—Nb, is formed adjacent the permalloy sensor layer 52 to provide a "transverse bias" for the sensor layer. This orients the magnetization of the sensor layer 52 at an angle close to 45 degrees with respect to the direction of the electric sensing current. Also, the permalloy sensor layer 52 is longitudinally biased to maintain it in a single magnetic domain state. Longitudinal biasing is typically accomplished with a hard magnetic material (hard biasing) or an antiferromagnetic material that exchange couples with the permalloy sensor layer (exchange biasing).

As previously explained, it is desirable to make the permalloy sensor layer 52 as thin as possible to maximize the magnetic recording density of the disk 12. However, a reduction in permalloy film thickness results in a reduction in $\Delta R/R$. This reduction is especially rapid as the film thickness decreases below approximately 100 Å.

PREFERRED EMBODIMENT OF THE MR SENSOR LAYER

Magnetron Sputtered Permalloy ($Ni_{81}Fe_{19}$) Films with Substrate Heating $Ni_{1-x}Fe_x$ (x approx 0.19) films were prepared by magnetron sputtering at 3 mTorr pressure and deposition temperatures ranging from room temperature (i.e., without substrate heating, or approximately 50° C. which was the measured ambient temperature in the sputtering chamber) up to 400° C. The films were prepared from a $Ni_{81}Fe_{19}$ target and deposited on substrates of 1000 Å alumina ($Al_2O_3$) on glass. This glass/alumina type of substrate structure was selected, rather than silicon/Ta, because Ta is known to interdiffuse with permalloy at elevated temperatures. The films were deposited in a small, approximately 30 Oersteds (Oe), magnetic field oriented approximately in the plane of the film, provided by a toroidal magnet placed outside the furnace in which the substrates were heated. The applied magnetic field is used to introduce a uniaxial magnetic anisotropy in the permalloy films as they are deposited. The substrates were heated radiantly by use of tantalum foil strips located near the substrate. The temperature was measured by a thermometer located near the substrate. The coercivities of the films were measured using a commercially available B-H looper. The effective thicknesses of the films were determined by measurement of the magnitude of their magnetic moments using the same B-H looper. The "effective" Ni—Fe film thickness is the actual thickness of the Ni—Fe film that possesses a magnetic moment, and thus excludes the fraction of the film which may have become nonmagnetic due to mixing with adjacent films or oxidation.

Figure 4:
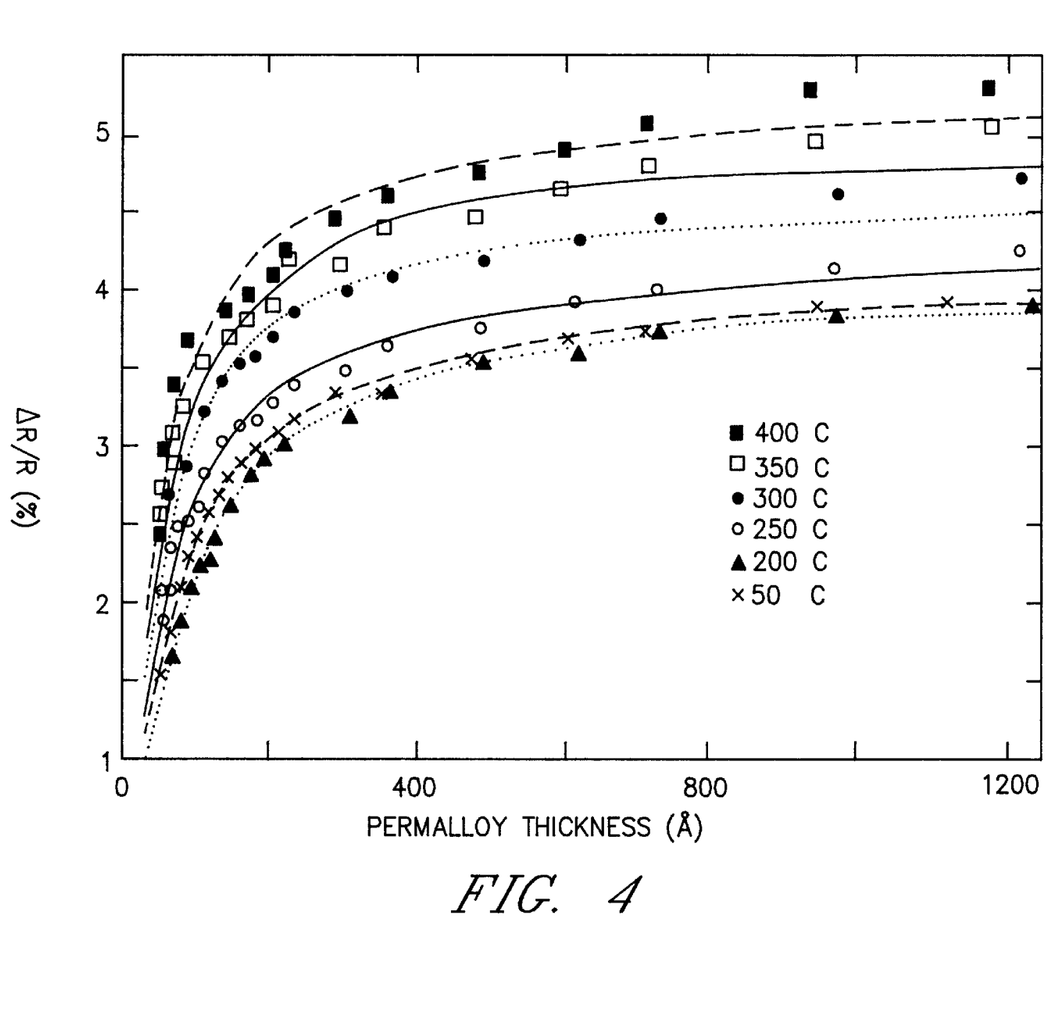
FIG. 4 is a family of curves, fitted to data, for ΔR/R as a function of film thicknesses up to approximately 1200 Å for permalloy films formed by conventional sputter deposition on substrates of 1000 Å alumina ($Al_2O_3$) on glass, at different substrate temperatures.
Figure 5:
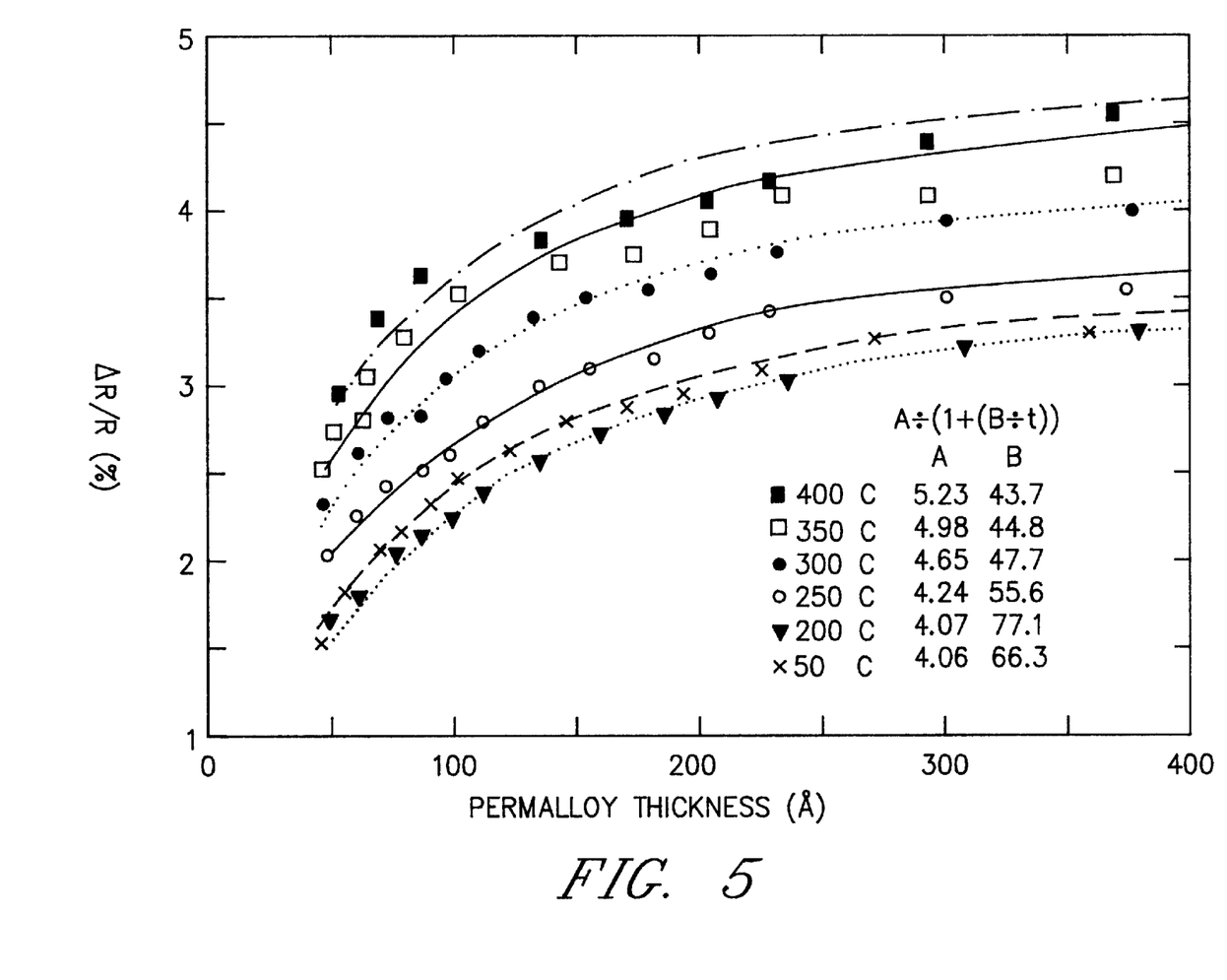
FIG. 5 is the family of curves for the data shown in FIG. 3 for the permalloy film thickness range between approximately 50 to 350 Å.

Films with thicknesses ranging from approximately 50 to 1200 Å were studied. FIG. 4 shows the $\Delta R/R$ data as a function of permalloy film thickness for the films formed at different substrate temperatures. FIG. 5 is the portion of FIG. 4 for permalloy film thicknesses in the range of approximately 50 to 400 Å. The data has been fitted to curves having the general relationship of equation (1), with the coefficient values for A and B tabulated on FIG. 5. The curves are compared with the data of FIG. 1, which is the state of the art highest achievable $\Delta R/R$ for permalloy film deposition without substrate heating (i.e., approximately 50° C. substrate temperature). The data of FIG. 1 is also reproduced on FIGS. 4 and 5, and is represented approximately as follows:

$$\Delta R/R = 4.1/(1+66.3/t) \qquad (2)$$

where $\Delta R/R$ is in percent (%) and t is in Angstroms (Å).

Figure 6:
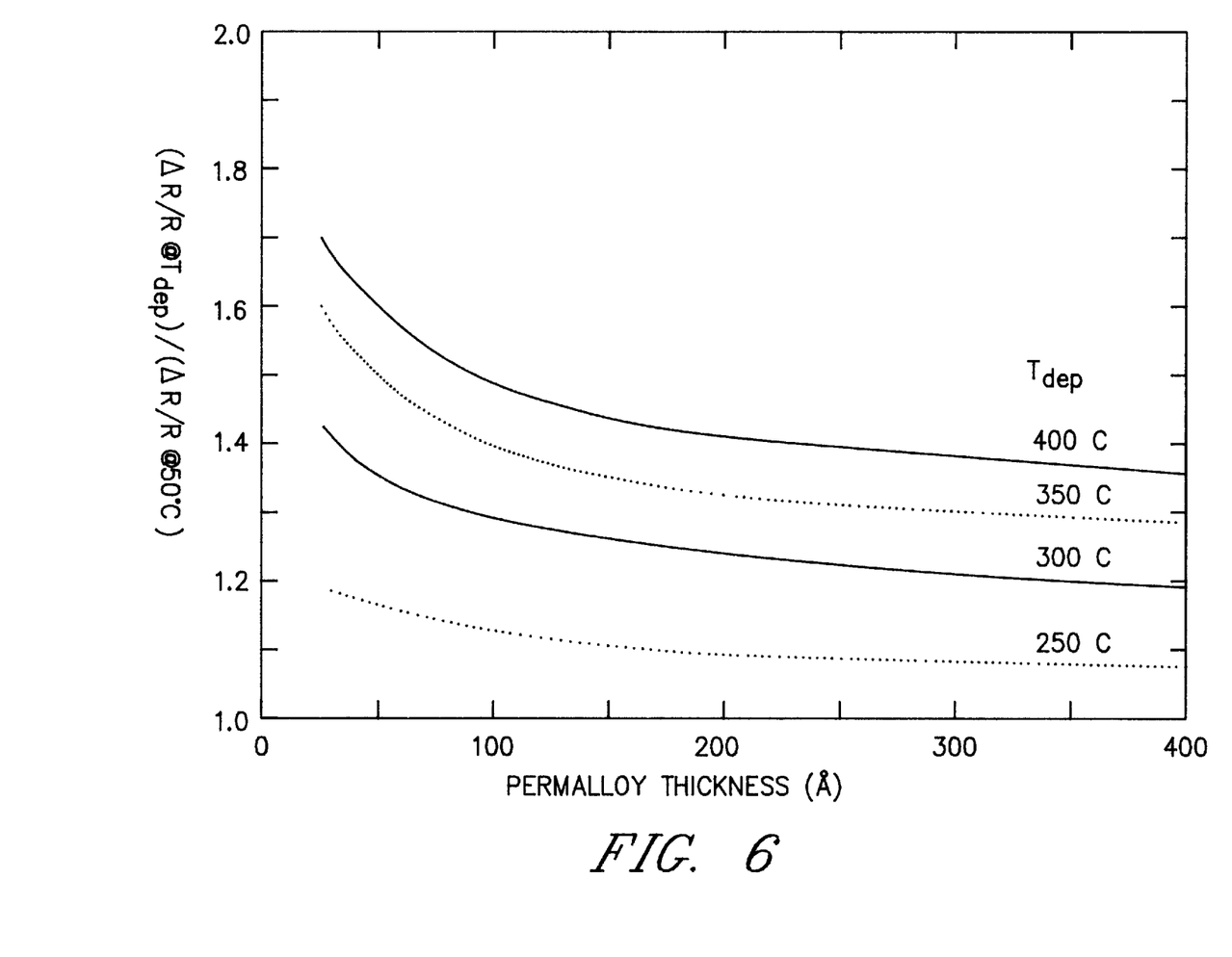
FIG. 6 is a graph showing the improvement of ΔR/R over permalloy film deposition without substrate heating at small film thicknesses.

As shown by FIGS. 4 and 5, there is no enhancement in $\Delta R/R$ at deposition temperatures below approximately 200° C. For deposition temperatures above 400° C., degradation in magnetic properties of the permalloy films was observed. For deposition temperatures between approximately 250 and 400° C., there is significant enhancement over the state of the art highest achievable $\Delta R/R$. More importantly, the percentage increase in $\Delta R/R$ is highest at the smallest permalloy film thicknesses, which is what is desired for high density magnetic recording applications. FIG. 6 is a representation of the ratio of $\Delta R/R$ with substrate heating to the $\Delta R/R$ of FIG. 1 (without substrate heating) as a function of film thickness. At approximately 50 Å permalloy film thickness, heating to only 250° C. results in a 15% increase in $\Delta R/R$, while heating to 400° C. results in a 60% increase in $\Delta R/R$.

The measured magnetostriction of all the films whose data is shown in FIGS. 4 and 5 was in all cases within the range of approximately $-4\times10^{-6}$ to $-2\times10^{-6}$. For use as the MR sensor layer in MR heads, the magnetostriction should preferably be between approximately $-5\times10^{-6}$ and zero. As will be explained below the magnetostriction for the films formed with substrate heating can be tuned by proper selection of film thickness and composition.

The measured anisotropy field of all the films whose data is shown in FIGS. 4 and 5 was determined in all cases to be in the range of approximately 3–10 Oe, which is clearly acceptable for MR sensor layers.

Magnetron Sputtered $Ni_{1-x}Fe_x$ (0.15<x<0.23) Films with Substrate Heating

Figure 7:
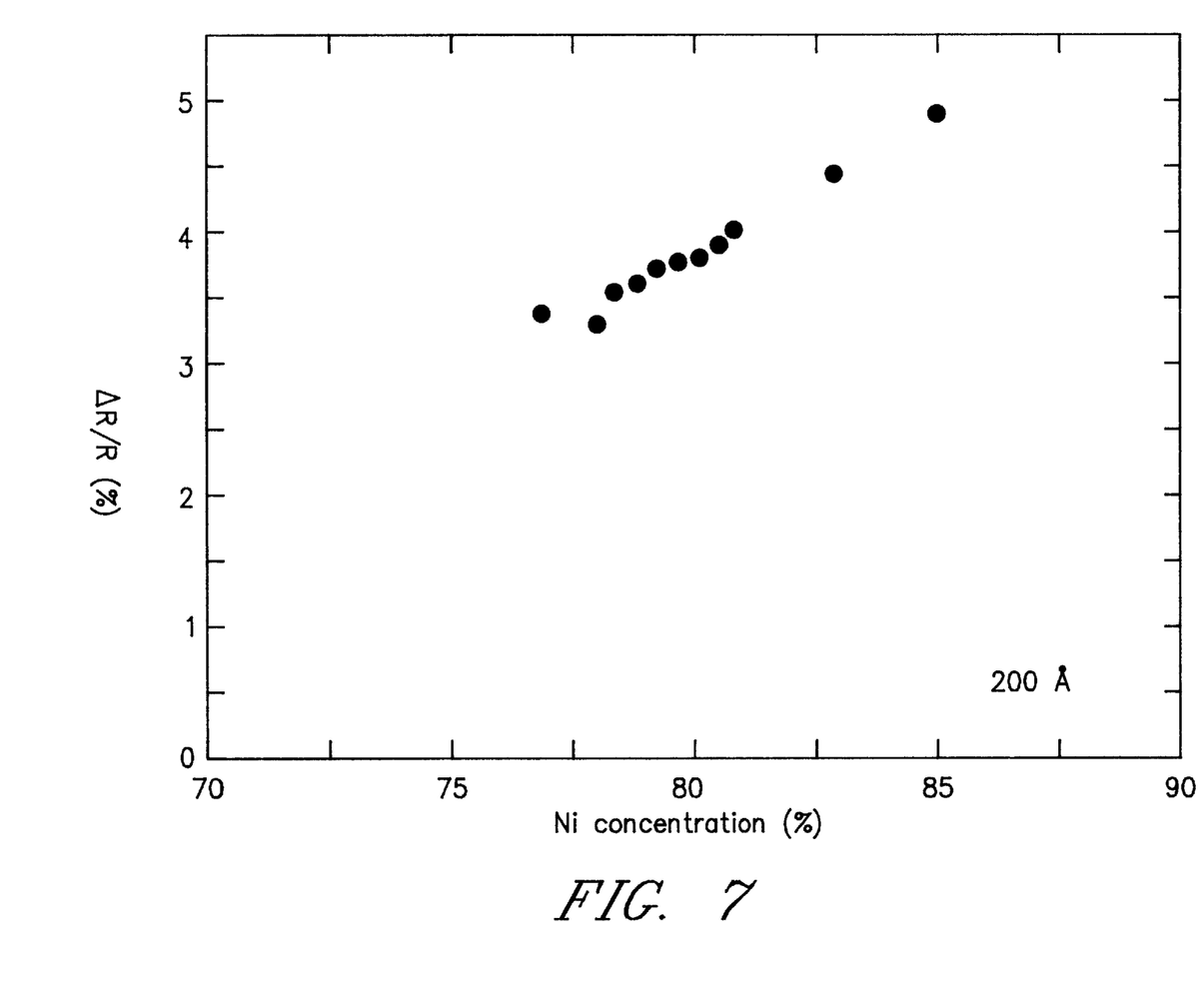
FIG. 7 is a graph of ΔR/R as a function of Ni concentration for Ni—Fe films of 200 Å thickness deposited on substrates of glass/1200 Å alumina at 400° C. substrate temperature.

The improved $\Delta R/R$ by use of substrate heating is not limited to the precise permalloy composition of $Ni_{81}Fe_{19}$, but was also observed for various compositions of magnetron sputter deposited $Ni_{81}Fe_{19}$, where x varied from about 0.15 to 0.23. FIG. 7 shows the relationship of $\Delta R/R$ as a function of Ni concentration for 200 Å thick $Ni_{1-x}Fe_x$ films deposited on glass/1200 Å alumina at 400° C. In all cases the $\Delta R/R$ is approximately between 3.4–4.9%, as compared to approximately 3.0% as the maximum achievable R for the comparable 200 Å $Ni_{81}Fe_{19}$ film deposited at room temperature on silicon/Ta (FIG. 5).

Figure 8:
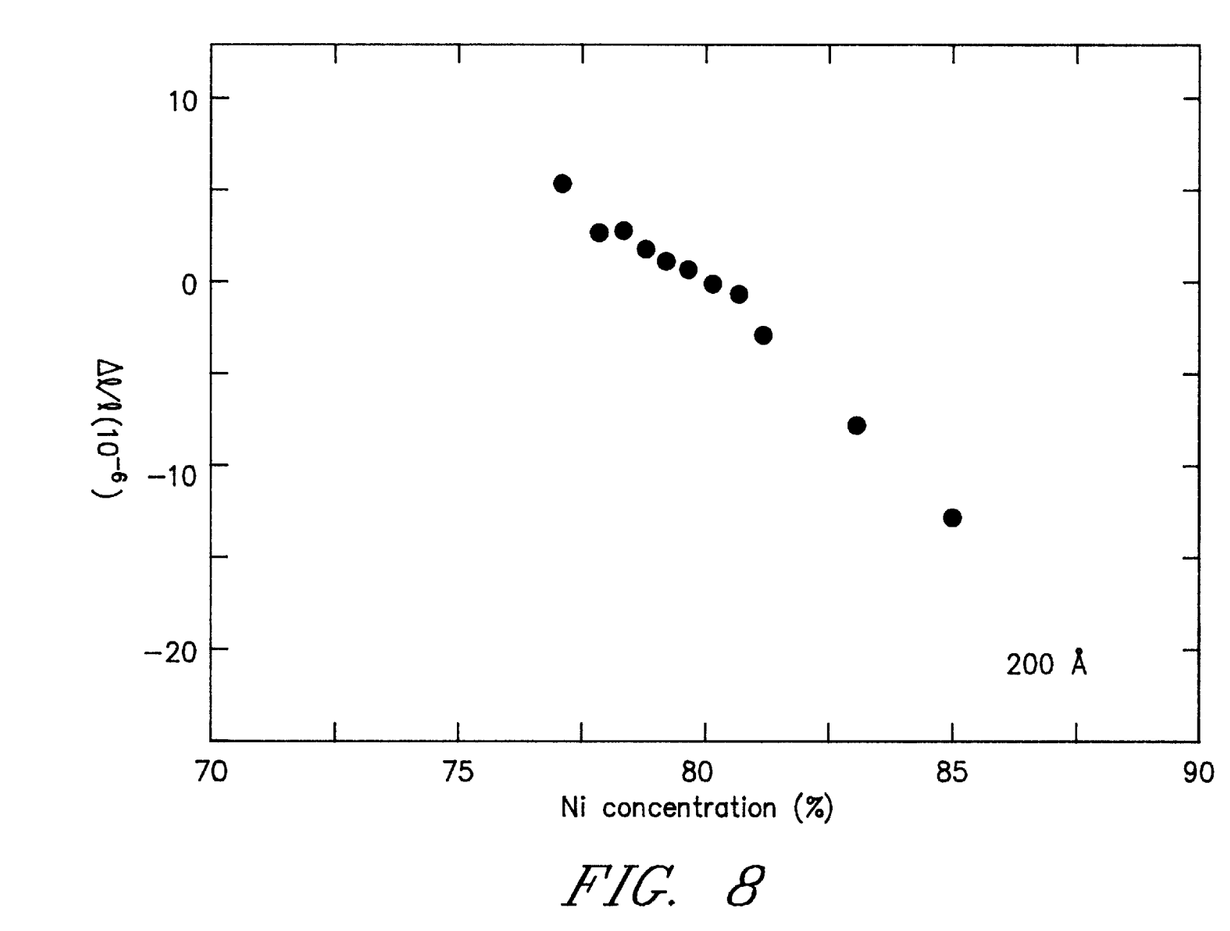
FIG. 8 is a graph of magnetostriction for the films whose data is shown in FIG. 7.

The measured magnetostriction ($\Delta l/l$) for these films is shown in FIG. 8. The $Ni_{81}Fe_{19}$ film in this data set has a magnetostriction of approximately $-2\times10^{-6}$, which is generally acceptable. A curve fit through the data of FIG. 8 shows that the magnetostriction crosses zero at a Ni—Fe film composition where the Ni percentage is approximately 80.5 From this data, in addition to the measured magnetostriction data for the permalloy films of various thicknesses (FIG. 4), it has been determined that while there is a thickness dependence on magnetostriction, magnetostriction is influenced more by the actual $Ni_{1-x}Fe_x$ composition than the film thickness or deposition temperature. The dependence of $\Delta l/l$ on permalloy film thickness for the same films indicates that small negative values of $\Delta l/l$ were found with a magnitude tending to increase with decreased film thickness. Similar increases in $\Delta l/l$ with decreased film thickness are known in the art and are believed to result from a film surface or interface contribution. Thus, by varying the film composition slightly for any particular film thickness, using the results such as those shown in FIG. 8, the magnetostriction of the $Ni_{1-x}Fe_x$ films deposited with substrate heating can be tuned to the desired value for use as the MR sensor layer.

High Vacuum (UHV) Evaporated $Ni_{1-x}Fe_x$ Films with Substrate Heating

Permalloy films (Ni concentration near 80%) were also deposited onto heated substrates by co-evaporation from separate Ni and Fe sources in a background vacuum of $10^{-7}$ mTorr. Substrates included single crystal wafers of yttria-stabilized cubic zirconia (i.e., $ZrO_2$: 10% $Y_2O_3$) of (100) orientation, as well as silicon (111), fused silica ($SiO_2$) and glass. The latter three types of substrates were pre-deposited with a 1000 Å films of sputtered, yttria-stabilized cubic zirconia. In all cases, the films were polycrystalline and had negligible preferred orientation both in-plane and out-of-plane. An in-plane magnetic field of 30 Oe, generated from a permanent magnet in contact with the back of each substrate, was applied during deposition to introduce a uniaxial magnetic anisotropy in the permalloy films. Permalloy films with composition near 80% Ni ($Ni_{80}Fe_{20}$) were grown at temperatures ranging from room temperature to 600° C. Thicknesses ranged from 100 to 1000 Å. These UHV evaporated films can also be deposited by evaporation from a single $Ni_{1-x}Fe_x$ source.

The films deposited at 370° C. showed an increase in $\Delta R/R$ from approximately a 20% to a 40% enhancement over the room temperature values. For the 100 Å films, the data showed an increased $\Delta R/R$ from about 2.1% to about 2.5% as the substrate temperature was increased from room temperature to 370° C.

Magnetostriction data were recorded for a series of UHV evaporated films of compositions from 78 to 83% Ni, growth temperatures from 30 to 370° C., and thicknesses in the range 160–190 Å. These films exhibited similar trends in $\Delta R/R$ to the 100 Å films. The magnetostriction data fits on a smooth line that crosses zero at a composition of approximately 80.6% Ni. This is the normal behavior found for permalloy films in this thickness range deposited at room temperature on Ta by magnetron sputtering. Thus deposition by UHV evaporation at elevated substrate temperatures did not result in any unusual magnetostriction behavior.

The measured easy axis coercivity $H_c$ of the films ranged between 0.8–3.0 Oe, indicating that the substrate heating did not cause an increase in coercivity beyond the range where the film can operate as the MR sensor layer.

Suitable Substrates for the Permalloy Films Deposited with Substrate Heating

While the data described above was for films formed on substrates of alumina or zirconia over glass, similar enhancements in $\Delta R/R$ with elevated substrate deposition temperatures were found for a wide range of suitable substrates, i.e., those which, like alumina and zirconia, do not chemically react with the $Ni_{1-x}Fe_x$ film at elevated temperatures. These substrates include oxides, nitrides or carbides of aluminum, zirconium, silicon or titanium. In particular, reaction with reactive substrate materials can be reduced by growing appropriate non-reactive, thermally stable buffer layers such as $Al_2O_3$, yttria-stabilized $Zr_2O_3$, $Si_2O_3$ and $Si_3N_4$, onto which the MR sensor layer is deposited. Other essentially non-reactive substrates which may react with the $Ni_{1-x}Fe_x$ film at elevated temperatures but in which the reaction is limited (e.g., up to approximately 10 Å into the $Ni_{1-x}Fe_x$ film) may also be suitable.

Thus in the present invention it is possible to significantly improve the $\Delta R/R$ of an MR head. In the prior art a Ta underlayer is required as a buffer layer over the alumina substrate (i.e., a Ta buffer layer is formed over the gap material 56 in FIG. 3 before the permalloy layer 52 is deposited) in order to achieve the highest known $\Delta R/R$, as shown in FIG. 1. Higher $\Delta R/R$ values have not been achievable without the Ta buffer layer. The present invention allows significantly higher $\Delta R/R$ than the highest achievable room temperature deposited films with Ta. This is accomplished by substrate heating and without the use of the Ta layer. The invention shows the greatest increase in $\Delta R/R$ at the low sensor layer thicknesses (approximately 50–200 Å) required for future high density magnetic recording. Moreover, even with substrate heating, the magnetostriction can be tuned to the desired value by the proper selection of Ni—Fe film thickness and composition.

While the preferred embodiments of the present invention have been illustrated in detail, it should be apparent that modifications and improvements may be made to the invention without departing from the spirit and scope of the invention as described in the following claims.

What is claimed is:

1. A magnetoresistive sensor comprising:
    a substrate essentially non-reactive with a Ni—Fe alloy at elevated temperatures;
    a film consisting essentially of a $Ni_{(1-x)}Fe_{(x)}$ alloy, where x is in the range of approximately 0.23 to 0.15, formed directly on the substrate to a thickness in the range of approximately 50 to 400 Å, the film having a magnetoresistance coefficient greater than $[4.1/(1+66.3/t)]$, where t is the film thickness in Å, and a magnetostriction in the range of approximately $-5\times10^{-6}$ to zero.

2. The sensor according to claim 1 wherein the substrate has a surface of a material consisting essentially of an oxide, nitride or carbide of aluminum, zirconium, silicon or titanium.

3. The sensor according to claim 1 wherein the film has a thickness in the range of approximately 50 to 200 Å and wherein the film has a magnetoresistance coefficient greater than $[4.2/(1+55.6/t)]$, where t is the film thickness in Å.

4. The sensor according to claim 1 wherein the value x and the thickness t are selected to make the magnetostriction substantially equal to zero.

5. The sensor according to claim 1 wherein the film is a sputter-deposited film deposited from a $Ni_{(1-x)}Fe_{(x)}$ alloy sputtering target.

6. The sensor according to claim 1 wherein the film is an evaporated film deposited from a single $Ni_{(1-x)}Fe_{(x)}$ source or from separate Ni and Fe sources.

7. A magnetoresistive sensor comprising:
    a substrate having a surface formed of a material consisting essentially of an oxide, nitride or carbide of aluminum, zirconium, silicon or titanium;
    a sputter-deposited film consisting essentially of a $Ni_{(1-x)}Fe_{(x)}$ alloy, where x is in the range of approximately 0.19 to 0.20, formed directly on the substrate surface to a thickness in the range of approximately 50 to 200 Å, the film having a magnetoresistance coefficient greater than $[4.2/(1+55.6/t)]$, where t is the film thickness in Å, and a magnetostriction substantially equal to zero.

8. A head assembly for a magnetic recording disk drive comprising:
    a slider having a surface facing the disk when the slider is located in the disk drive and a trailing end;
    a layer of a material consisting essentially of an oxide, nitride or carbide of aluminum, zirconium, silicon or titanium located on the slider trailing end; and
    a head formed on the trailing end of the slider, the head comprising:

a magnetoresistive sensor comprising a film consisting essentially of a $Ni_{(1-x)}Fe_{(x)}$ alloy, where x is in the range of approximately 0.23 to 0.15, formed directly on the layer located on the slider trailing end to a thickness in the range of approximately 50 to 200 Å, the film having a magnetoresistance coefficient greater than $[4.2/(1+55.6/t)]$, where t is the film thickness in Å, and a magnetostriction in the range of approximately $-5\times10^{-6}$ to zero.

9. The head assembly according to claim 8 further comprising an inductive write head formed on the carrier.

10. A magnetic recording system of the type having a magnetic recording medium and a magnetoresistive sensor for reading data recorded on the medium, the system comprising:

a carrier for supporting the magnetoresistive sensor near the medium, the carrier having a surface of a material consisting essentially of an oxide, nitride or carbide of aluminum, zirconium, silicon or titanium;

a magnetoresistive sensor comprising a film consisting essentially of a $Ni_{(1-x)}Fe_{(x)}$ alloy, where x is in the range of approximately 0.23 to 0.15, formed directly on said surface to a thickness in the range of approximately 50 to 200 Å, the film having a magnetoresistance coefficient greater than $[4.2/(1+55.6/t)]$, where t is the film thickness in Å, and a magnetostriction in the range of approximately $-5\times10^{-6}$ to zero;

means for moving the medium and the carrier relative to one another; and means electrically coupled to the magnetoresistive sensor for detecting changes in electrical resistance of the sensor representative of magnetic flux from the medium.

11. The magnetic recording system according to claim 10 further comprising an inductive write head formed on the carrier.

* * * * *